(12) United States Patent
Jones et al.

(10) Patent No.: US 7,952,363 B2
(45) Date of Patent: May 31, 2011

(54) SYSTEM AND METHOD FOR SORTING DETECTION OF SIGNAL EGRESS FROM A WIRED COMMUNICATION SYSTEM

(75) Inventors: Raymond Gregory Jones, Stephens City, VA (US); Joseph Roy Early, Harrisonburg, VA (US)

(73) Assignee: ComSonics, Inc., Harrisonburg, VA (US)

( * ) Notice: Subject to any disclaimer, the term of this patent is extended or adjusted under 35 U.S.C. 154(b) by 465 days.

(21) Appl. No.: 12/109,404

(22) Filed: Apr. 25, 2008

(65) Prior Publication Data

US 2009/0267615 A1 Oct. 29, 2009

(51) Int. Cl.
*G01R 31/02* (2006.01)
(52) U.S. Cl. ........ 324/544; 725/123; 725/107; 342/465; 342/459; 455/226.2; 455/436
(58) Field of Classification Search .................... 324/544
See application file for complete search history.

(56) References Cited

U.S. PATENT DOCUMENTS

| | | | | | |
|---|---|---|---|---|---|
| 749,436 | A | * | 1/1904 | DeForest | 342/458 |
| 758,517 | A | * | 4/1904 | DeForest | 342/458 |
| 1,183,802 | A | * | 5/1916 | DeForest | 342/350 |
| 4,818,998 | A | * | 4/1989 | Apsell et al. | 342/444 |
| 5,294,937 | A | * | 3/1994 | Ostteen et al. | 342/459 |
| 5,448,248 | A | * | 9/1995 | Anttila | 342/400 |
| 5,625,364 | A | * | 4/1997 | Herrick et al. | 342/449 |
| 5,777,662 | A | * | 7/1998 | Zimmerman | 725/125 |
| 5,982,165 | A | * | 11/1999 | Bowyer et al. | 324/95 |
| 6,021,269 | A | * | 2/2000 | Lewis | 703/5 |
| 7,395,548 | B2 | * | 7/2008 | Runzo | 725/107 |
| 2003/0022645 | A1 | * | 1/2003 | Runzo | 455/226.2 |
| 2003/0100317 | A1 | * | 5/2003 | Kaplan et al. | 455/456 |
| 2004/0166881 | A1 | * | 8/2004 | Farchmin | 455/457 |
| 2004/0210938 | A1 | * | 10/2004 | Eckenroth et al. | 725/107 |
| 2004/0219927 | A1 | * | 11/2004 | Sumner | 455/456.1 |
| 2006/0217127 | A1 | * | 9/2006 | Drane et al. | 455/456.1 |
| 2006/0248565 | A1 | * | 11/2006 | Shimp et al. | 725/123 |
| 2007/0022457 | A1 | * | 1/2007 | Eckenroth et al. | 725/107 |
| 2007/0159991 | A1 | * | 7/2007 | Noonan et al. | 370/310 |
| 2008/0039114 | A1 | * | 2/2008 | Phatak et al. | 455/456.1 |
| 2008/0125161 | A1 | * | 5/2008 | Ergen et al. | 455/524 |
| 2009/0219211 | A1 | * | 9/2009 | Kimball | 342/465 |
| 2010/0035630 | A1 | * | 2/2010 | Bosnjakovic et al. | 455/456.1 |

* cited by examiner

*Primary Examiner* — Timothy J Dole
*Assistant Examiner* — Benjamin M Baldridge
(74) *Attorney, Agent, or Firm* — Whitham, Curtis, Christofferson & Cook, P.C.

(57) ABSTRACT

Issuance of work orders in response to monitoring signal egress from shielding integrity flaws in a cable communication system by detecting received signal strength from a mobile receiver only during rising trends in received signal strength when the mobile receiver is in motion and tracking the maximum received signal strength peak during each rising trend. Rising trends are detected by computing two rolling averages of received signal strength sample of different lengths and offset from each other and applying a threshold to the difference between the rolling averages to provide hysteresis in switching between rising and falling trend detection. Reported peaks are then compared by proximity to each other and their circle of influence determined in accordance with respective signal strengths to determine if newly reported peaks are duplicates of previously reported peaks and duplicate reported peaks are removed or discarded.

16 Claims, 6 Drawing Sheets

SYSTEM AND METHOD FOR SORTING DETECTION OF SIGNAL EGRESS FROM A WIRED COMMUNICATION SYSTEM

BACKGROUND OF THE INVENTION

1. Field of the Invention

The present invention generally relates to maintenance of wired/cable communication systems and, more particularly, to detecting and reporting locations of flaws in shielding integrity in the communication system based on signal egress and reporting and remediation thereof.

2. Description of the Prior Art

Wired communication systems have been known for many years and, due to the initial simplicity and limited usage and bandwidth of early systems, the wiring structure was not generally critical to the performance thereof and did not tend to affect operation of other devices proximate thereto or wireless communication systems. At the present time, however, wired communication systems (often referred to as cable telecommunications systems or, simply as cable communications systems or cable systems) use high frequency carrier signals to provide increased bandwidth and information transmission capacity as well as to accommodate digital signaling at very high bit rates. Such high frequency carriers require the use of shielded coaxial cables for efficient transmission while demands for wireless communication bandwidth has resulted in overlap of wireless communication frequency band allocation with the frequency band currently used for wired communications, as is made possible, at least theoretically, by the fact that the required shielding maintains separation between wired and wireless communications operating in the same frequency bands. At the present time, the frequencies allocated for wired cable distribution and communication systems substantially overlaps or is overlapped by the frequency band used for commercial aircraft communication and navigation. Therefore, the possibility of signal leakage from a wired communication system is quite critical and wired systems must be constructed and maintained to limit radiation therefrom, referred to as signal egress, below stringent limits under Federal Communications Commission regulations.

However, a shielding flaw in a wired communication system has substantially symmetrical or complementary effects and thus also permits signal ingress from the environment where electromagnetic signal components at the frequency band(s) of interest are becoming greater over time. From the standpoint of a cable communication system operator, signal ingress is a severe problem, particularly for digital communications, since corruption of a digital signal packet beyond the degree which can be recovered using error correcting codes (ECCs) and the like requires retransmission of the packet. The time required for detection of the error and retransmission of packets containing unrecoverable errors slows system operation and reduces capacity of the system.

Accordingly, detection and correction of flaws in shielding integrity is critical to both wired and wireless communications. At the same time, increases in communications, generally, have resulted in continuing increases in electromagnetic signals in the frequency band of interest which complicates signal egress detection.

While receivers of very high sensitivity and selectivity have been developed for signal egress detection, sufficient monitoring of a cable communication system to provide adequate maintenance generally requires substantially constant monitoring of the entire geographic extent of the cable communication system using such receivers in vehicles traveling on public roads which may or may not be proximate to the route of communications cables to detect signals which may represent signal egress. To facilitate this process, a signal egress detection system developed by Comsonics, Inc. of Harrisonburg, Va., the assignee of the present invention, has developed a system that combines a suitably sensitive receiver with a global positioning system to automatically capture the location at which signals that possibly represent signal egress from the cable system are detected and prepares a report that can be immediately transmitted to a central facility or stored and later downloaded. Such reports can then be automatically converted to work repair orders to be executed by crews employed by the cable operator to find the shielding integrity flaw and effect repairs.

However, such procedures can result in many reports and work orders which are effectively duplicates and may contain errors due to interference signals being detected as potential signal egress. Some systems have been developed to validate a detection at a particular frequency as signal egress rather than simply interference signals, but merely sorting even validated reports by location where a validated egress signal is detected, while sufficient for system maintenance, is insufficient to avoid a large number of duplicate work orders since the signal radiation pattern from a shielding integrity flaw without prior information in regard to the nature (e.g. geometry) of the flaw is not readily predictable and a single flaw may be detectable from numerous locations; leading to unnecessary costs and reduced efficiency of operation of the cable communication system.

SUMMARY OF THE INVENTION

It is therefore an object of the present invention to provide a system and method which minimizes duplication of reports of potential shielding integrity flaws in a wired or cable communication system.

In order to accomplish these and other objects of the invention, a method and computer program product are provided for performing steps of detecting a rising trend in received signal strength at a mobile receiver, comparing a signal strength peak received at the mobile receiver against other peaks received during the rising trend in signal strength, and retaining and reporting the signal strength peak found to be largest during the rising trend in signal strength while discarding lesser peaks and peaks occurring during periods other than during said rising trend in signal strength and for performing steps of determining if a signal strength peak reported is a duplicate of an existing signal strength peak previously reported, and discarding one of the signal strength peaks determined to be a duplicate of the other.

In accordance with another aspect of the invention, an apparatus for detecting and reporting shielding integrity flaws in a cable communication system is provided comprising a mobile receiver operating in a carrier frequency band of the cable communication system to provide received signal strength samples, a global positioning system for periodically reporting a location of the mobile receiver, a register for holding the samples, an arrangement for computing averages of different groups of samples in the register, a comparator for comparing the averages and detecting a rising trend in the samples, an arrangement for determining a maximum signal strength sample during a duration of the rising trend in the samples, and an arrangement for reporting signal strength and detection location for the maximum signal strength sample.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
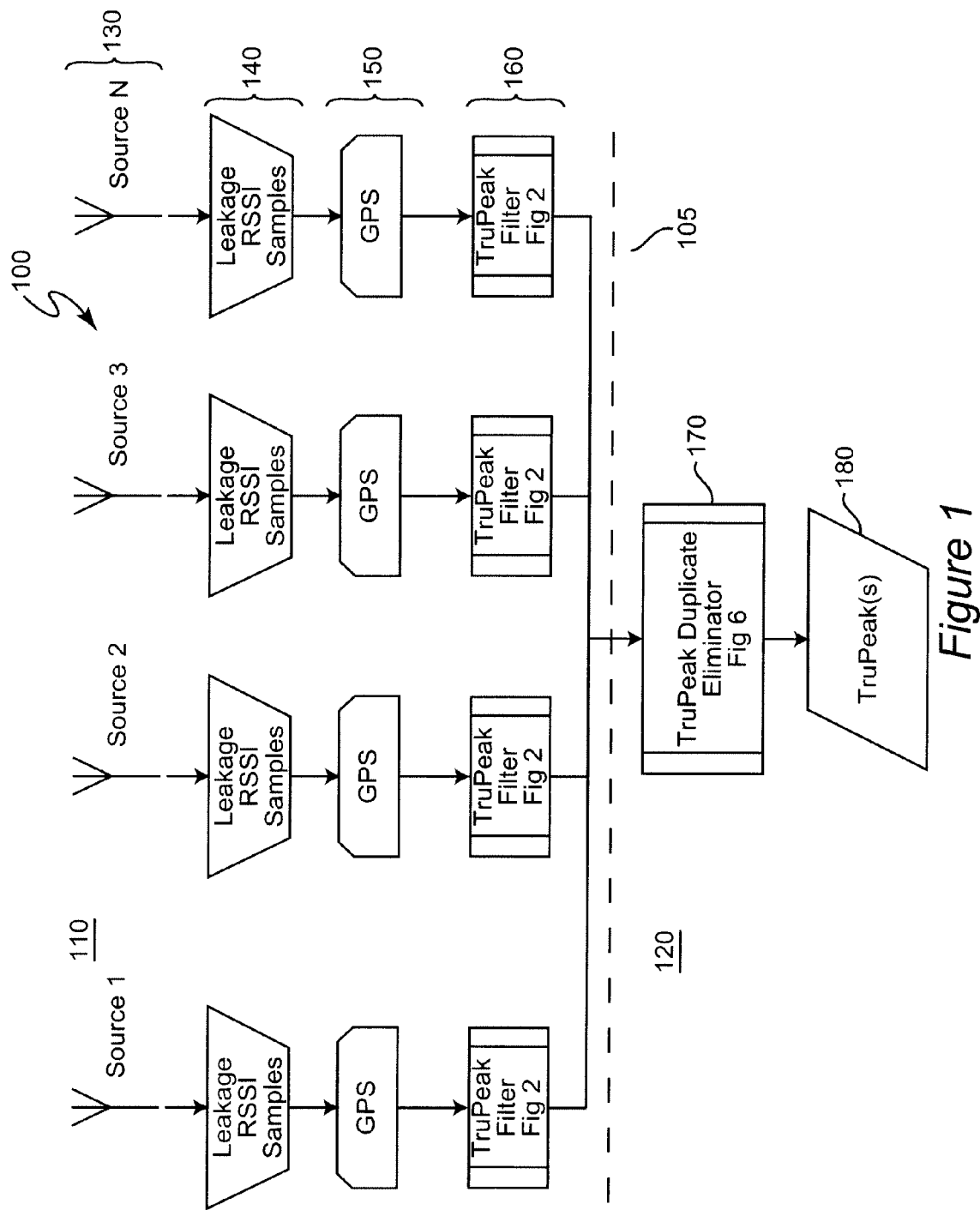
FIG. 1 is a block diagram of the overall architecture of the signal egress detection system in accordance with the invention.

Referring now to the drawings, and more particularly to FIG. 1, there is shown, in the form of a high-level block diagram, an overview of the system 100 in accordance with the present invention. It will be initially noted that system 100 is divided, as indicated by dashed line 105 into two portions 110 and 120 which is an articulation of the reporting process as indicated above. It may be helpful to observe that portion 110 includes several identical (at the level of abstraction illustrated in FIG. 1) branches and that each of these branches corresponds to a mobile field location for monitoring egress from the cable system and that portion 120 corresponds to processing performed at, for example, a central facility which may or may not be geographically associated with a central facility of the cable system. The invention is applied to components of each of these portions 110, 120 as indicated by the references to FIGS. 2 and 6, respectively and thus no part of FIG. 1 is admitted to be prior art in regard to the present invention.

In FIG. 1, reference numeral 130 represents a plurality of independent receivers capable of detecting signals which may potentially correspond to signal egress from a cable communication system, reference numeral 140 represents the received signal strength indication (RSSI) of samples corresponding to the signals received by receivers 130, 150 represents a global positioning system (GPS) which can supply a location corresponding to the RSSI samples 140. Filters 160 represent one or more instances of a filter in accordance with the present invention which is preferably implemented in accordance with the processing which is depicted in FIG. 2 and which will be explained in detail in connection with FIGS. 3-5.

It should be appreciated that a sampling interval for the RSSI measurements 140 (which may or may not directly correspond to the samples processed by the filter is conveniently chosen as a submultiple (e.g. one-tenth) of the position reporting interval of the GPS systems 150 which is typically once per second. If receivers 130 and other components of the system portion 110 are located in mobile vehicles, such a sampling interval of one-tenth second corresponds to approximately 7.3 feet if the vehicle is traveling at fifty miles per hour. Thus, the spatial resolution of the RSSI measurements, even at relatively high speed, is preferably comparable to that of a stationary GPS system (usually about two meters) and changes in speed do not normally compromise refinement of the GPS location between reported locations through interpolation techniques between reported GPS locations (e.g. 73 feet apart at fifty miles per hour). By the same token, while GPS systems with higher spatial resolution may be available or foreseeable, such higher spatial resolution is unnecessary to the successful practice of the invention.

It should also be appreciated that the spatial resolution even at relatively high speed will provide numerous samples of signals (preferably, a sample is the largest peak measured during a one second GPS position reporting interval but such pre-processing is neither necessary nor important to the successful practice of the invention) which may emanate from a flaw in shielding integrity and, in practice, numerous samples of spatially varying signal strengths of interference due to, for example, standing waves and other interference effects of signals from multiple sources as is characteristic of interference signals may be present. The function of filter(s) 160 is to identify a single maximum RSSI peak, if one exists, among multiple RF samples logged with associated GPS position in a moving vehicle while providing substantial rejection of RSSI peaks due to other sources and interference effects. The accomplishment of this functionality will now be discussed in detail in connection with FIGS. 2-5.

Figure 2:
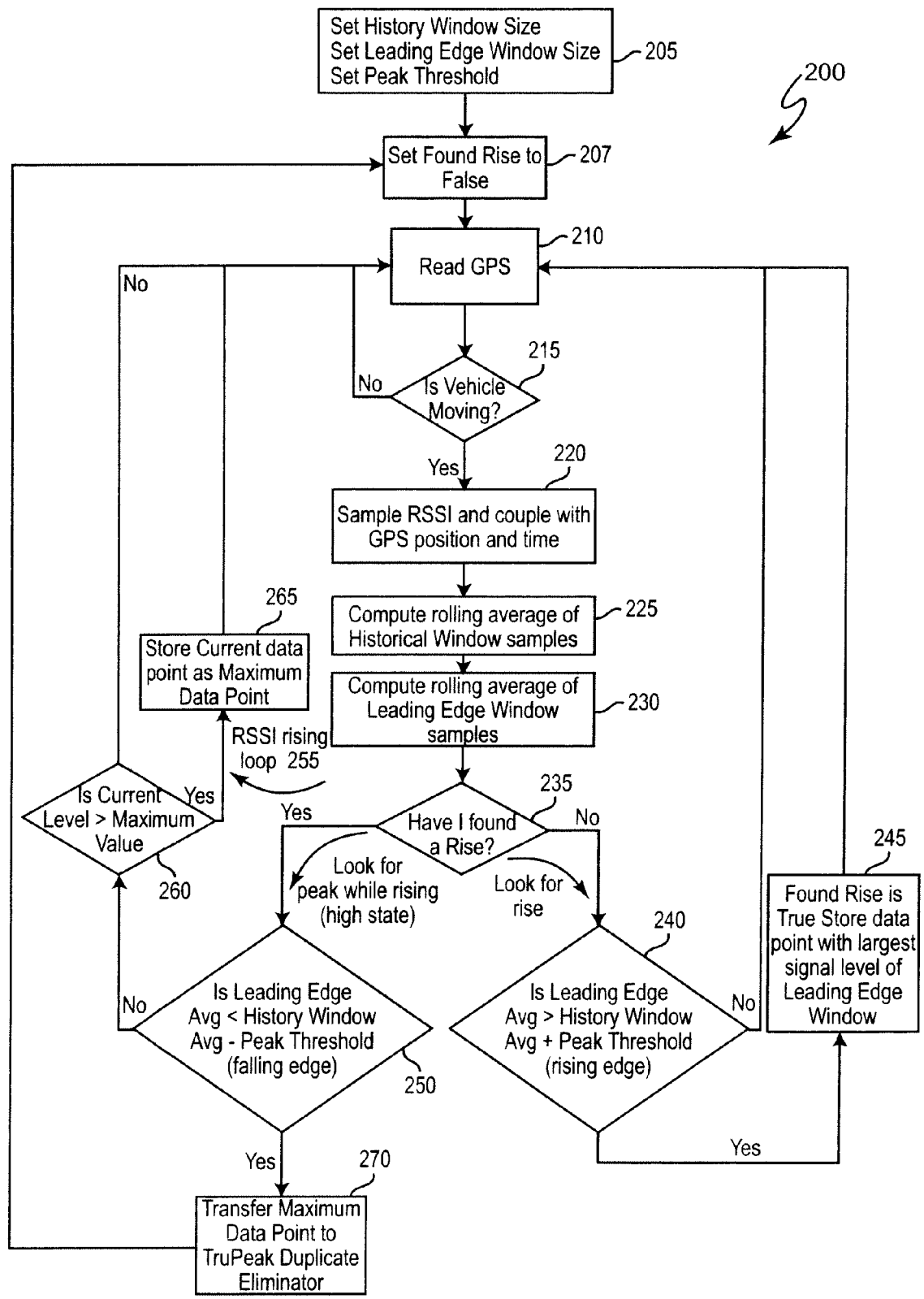
FIG. 2 is a flow chart representing processing in accordance with the invention for resolving numerous signal detection into a single peak amplitude detection.

The processing depicted in the flow chart of FIG. 2 assumes both that a receiver 130 is tuned to the frequency or frequency band of interest and access to a GPS receiver. The process looks for an increasing trend in signal strength based on an average of samples that may correspond to a leading edge of an RSSI maximum in which a true peak (e.g. associated with a shielding flaw which can be approached by a moving vehicle as distinguished from a peak due to other sources or interference effects which may be very large but, due to wavelengths will have effects over smaller distances) as compared with an average of historical samples plus a threshold. Once an increasing trend in signal strength has been reliably identified, a peak is identified among each of the additional samples along with the first leading edge samples that triggered the increase and a maximum peak is determined. Only that maximum peak during a given increasing trend in signal strength is retained. Once a decrease in signal strength is detected and measured, preferably using the same threshold criteria, the maximum peak remaining is identified as the peak of interest and can be recorded with its associated location and reported to a central facility in due course (e.g. immediately reported using wireless communication such as a cellular telephone system or stored and later downloaded at a convenient time and location). Peaks that do not occur during periods of increasing signal strength trends are ignored as anomalous based on a likelihood that measurement from a moving vehicle will cause increasing and decreasing trends in signal strength as the receiver approaches and is moved away from a shielding integrity flaw.

Figure 3:
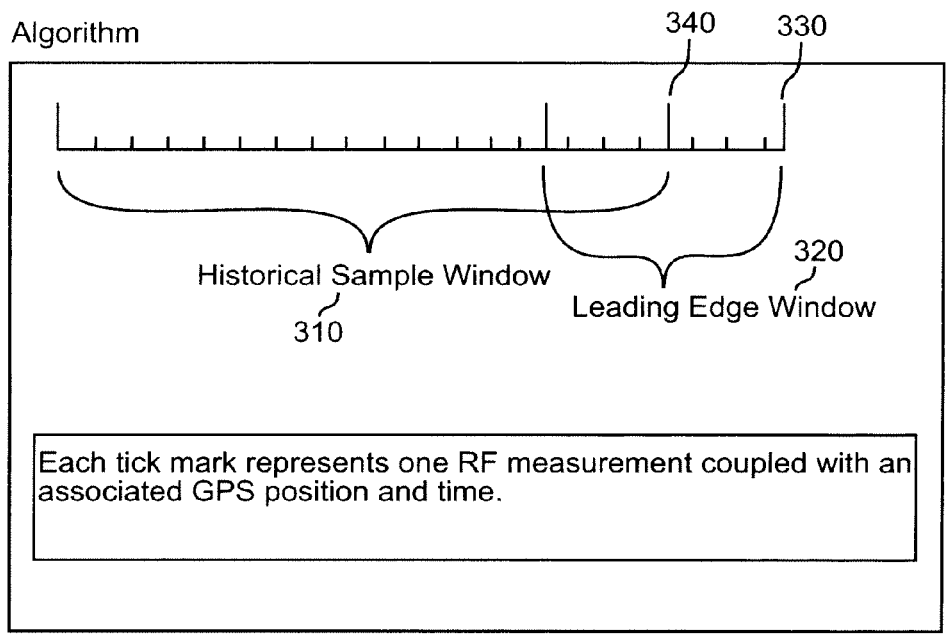
FIG. 3 is a diagram showing an exemplary application of a historical sample window and a leading edge window in accordance with the methodology of FIG. 2, FIGS. 4 and 5 graphically illustrate application of windows of FIG. 3 of varying widths to received signal strength data in accordance with the methodology of FIG. 2.

Referring now to FIG. 2, the processing for filtering RSSI samples begins with initialization indicated generally at 205. The filtering which this processing performs is based on two windows: a historical sample window and a leading edge window. A rolling average of RSSI values is computed over each of these windows and their sizes and offset must be initially set as will be discussed in greater detail below. The preferred relationship of the historical sample window and the leading edge window is illustrated in FIG. 3. The historical sample window 310 begins with a sample which is earlier in time than the current sample 330 and extends for a relatively arbitrary number of earlier samples suitably large to suppress large, rapid changes in the average of the RSSI samples although the average will naturally and desirably vary substantially over time with the RSSI signals but not so large as to impose an impractical computational burden or to mask changes in the background interference levels as receiver location changes. The size of the leading edge window 320 should be shorter than the historical sample window and preferably begins with the current sample 330 although some delay is tolerable and may be required in some cases for additional signal processing (e.g. to validate samples against noise/interference) which is not necessary for successful practice of the invention in accordance with its basic principles but which may be included as perfecting features thereof.

The first sample 340 of the historical sample window 310 is preferably centered within the leading edge window 320 but doing so is not critical to the successful practice of the invention and the invention may be successfully practiced with no overlap at all. It is only necessary that the leading edge window not be coextensive with the historical sample window (in which case the averages over the respective windows would be necessarily equal) and that the center of the leading edge window precede the center of the historical sample window. Generally, it is desirable that some samples be included in the leading edge window 320 which are not included in the historical sample window 310 to provide practical levels of sensitivity to rising and falling trends. The duration or number of samples in the leading edge and historical sample windows 320, 310 will have a substantial effect on the number of peaks detected as will be discussed below in connection with FIGS. 4 and 5.

Additionally, as part of initialization 205, a threshold for peaks above the average of the samples in the historical sample window must be established at a value which allows determination of a trend in RSSI sample values (which may vary somewhat with leading edge window size) and whether the trend is upward or downward (which may, as a practical matter, be defined as beginning with termination of an upward trend). As with the leading edge window size, the threshold may have a significant effect on the number of peaks in the RSSI samples that are detected as "true peaks".

In general, the threshold should be large enough to correctly distinguish trends in RSSI sample values from the ragged peaks that generally characterize RSSI sample data due to directionality of egress from flaws in shielding integrity, interference effects caused by phase and frequency of interference signals and/or signal egress and the fact that large egress peaks cause artifacts in the RSSI sample data that look like many additional peaks.

Further, a flag or the like which indicates a "found rise" (e.g. that a rising trend in the RSSI samples has been found) is initially set to "false" as illustrated at 207. This initial setting of the "found rise" flag may be considered as initialization but is separately depicted since it is also reset when a downward trend is detected.

In practice, it has been found to be desirable to set the sizes of the historical sample window and the leading edge window and their relative time position in regard to the samples they contain such that one rising trend and one falling trend are detected no more frequently than one per second in a given system environment to correspond to the GPS position reporting rate while the threshold can be made very small and non-critical as will now be discussed.

It should also be understood, in this regard that any reported peak can represent a shielding integrity flaw but that the cost of a work order, even to verify that such a flaw exists carries a substantial cost to the cable system operator. Therefore, it is important to eliminate as many peaks as possible which may represent "false positives" due to ambient electromagnetic noise and interference effects even if some peaks representing actual signal egress are lost. Actual signal egress will be persistent and is likely to be reported again while noise and interference effects are much less likely to be persistent. Further, peaks due to interference effects may disappear when shielding flaws are corrected. The number of peaks reported can be varied at will in accordance with the invention as will now be explained.

Figure 4:
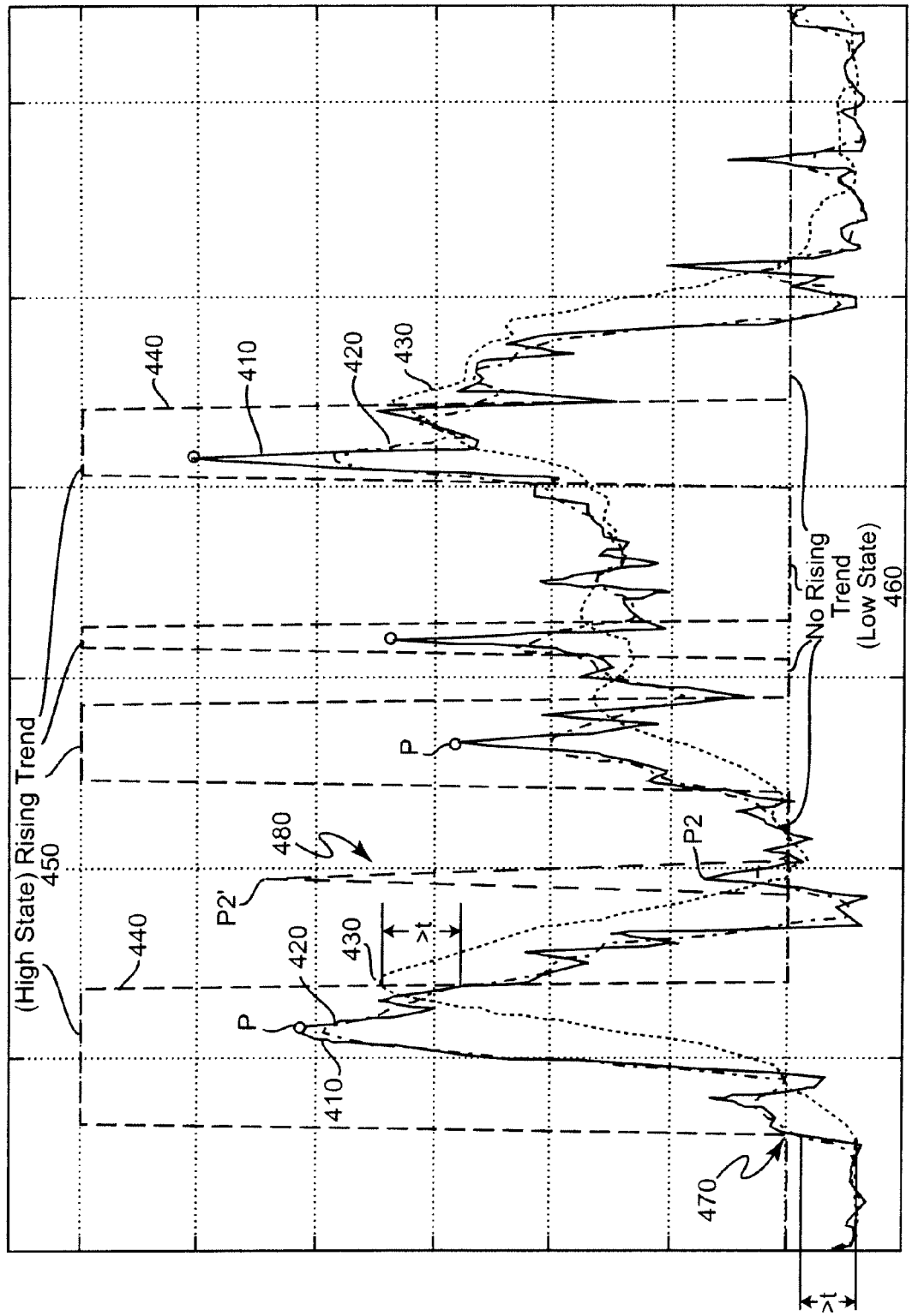
Figure 5:
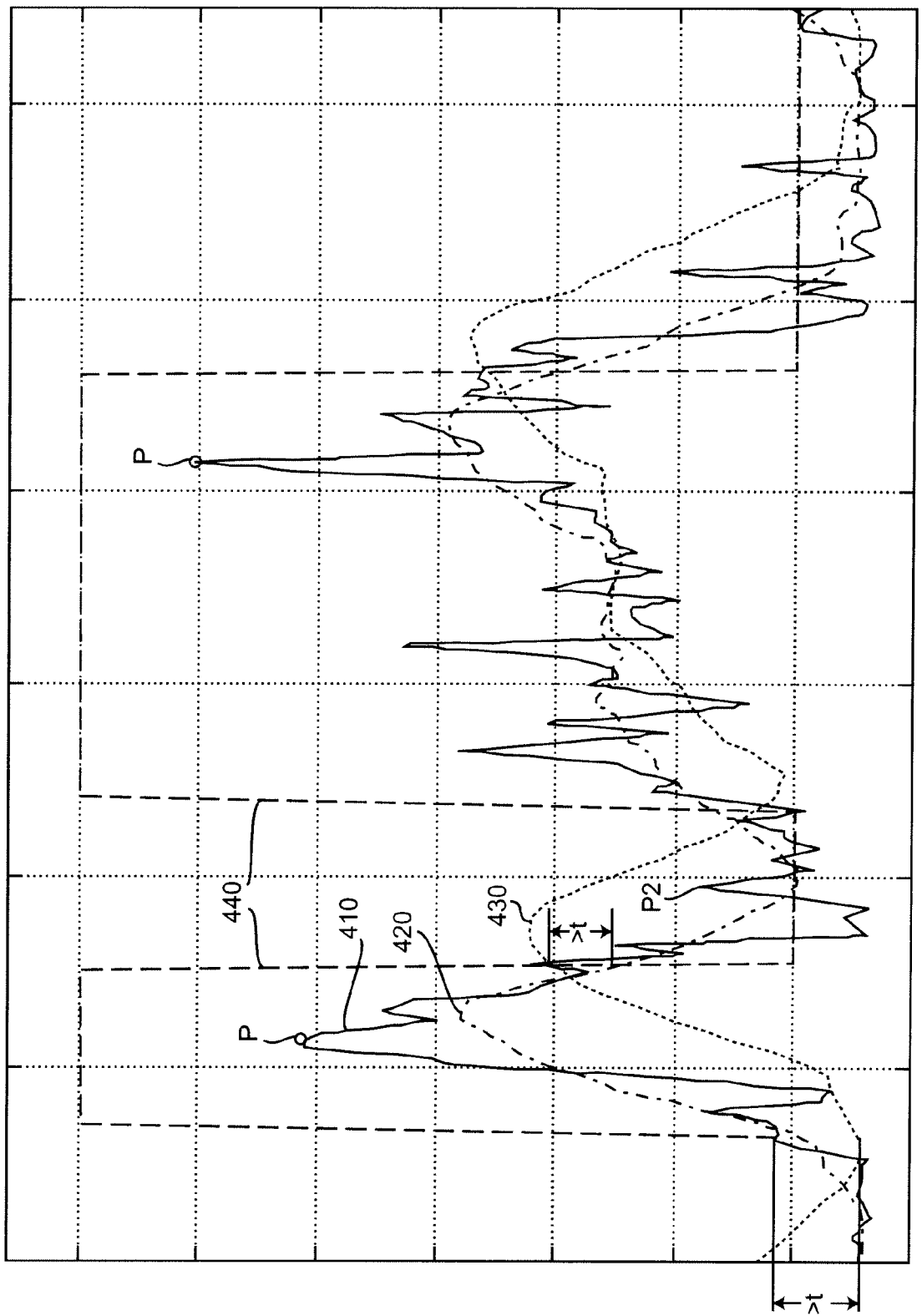

Referring now to FIGS. 4 and 5, "raw" RSSI data (e.g. possibly but not necessarily pre-processed, as alluded to above, to limit the samples to the maximum RSSI measurement for each GPS position) is depicted by a solid line 410 connecting the values of the individual samples and represents many local peaks. The "harshness" of the signal environment due to both potential egress from one or more shielding flaws and the possibility of interference signals therefrom and environmental effects in which the invention must operate and yield useful results is evident from the jaggedness of trace 410 (depicted by a solid line) having a local peak every few samples. This data is identical in both FIGS. 4 and 5 while the remainder of the traces of FIGS. 4 and 5 differ only by the number of samples in each of the leading edge window 320 and historical average window 310 although processing of the raw data is otherwise identical including the magnitude of threshold, t, applied. The leading edge window average 420 (depicted by a chain line), being averaged over a relatively small number of samples generally follows trace 410 but is slightly more smooth and exhibits smaller peaks. Since it contains the current RSSI sample and a relatively small number of earlier samples, trace 420 is offset very slightly to the right from trace 410 in FIGS. 4 and 5.

The average of the samples contained in the historical sample window 310 is based on a larger number of samples than the leading edge window 320. Thus the average 430 (depicted by a dotted line) over the historical sample window is further smoothed, exhibits fewer and even smaller peaks and is farther offset to the right compared with traces 420 and 410 while it remains highly variable. It will be noted that these differences of traces 420 and 430 from the raw data traces 410 are more evident in FIG. 5 than in FIG. 4 due to the difference in sizes of windows 310 and 320. It is important to recognize that the relative offsets of traces 420 and 430 from trace 410 also implies that the historical sample window average trace 430 will also be offset to the right relative to the leading edge window average trace 420.

Trace 440 (depicted by a dashed line) is substantially a square wave which assumes a high state 450 (as depicted) when a rising trend is detected in raw data 410 following a sample which results in 420 exceeding 430 by more than a threshold, t, as depicted at 470 and resets to a low state 460 (as depicted) when a falling trend is detected when 430 exceeds 420 by a similar threshold amount, t, (e.g. when the leading edge average 420 is less than the historical average 430 reduced by a threshold amount) for a particular sample as indicated at 480 which continues until a rising trend 450 is again detected, as depicted at 490, and so on. These points of transition of trace 440 may also be more apparent in FIG. 5 than in FIG. 4 since FIG. 5 represents averaging of more samples in each of traces 420 and 430.

Thus it is seen that the threshold, t, may be made very small and non-critical as a result of the historical sample average and the leading edge window average being taken over different numbers of samples which are offset in time from each other and is preferably set as will be noted below in the detailed discussion of FIG. 2. In practical effect, such a threshold is only necessary to distinguish rising trends from falling trends in the raw data 410 and to provide some amount of hysteresis and corresponding slight reduction in the sensitivity to possible transitions between states when a high state begins and ends, respectively. This distinction is important because only peaks which occur during a high state are considered as potential flaws in shielding integrity which a mobile receiver can approach and depart from, thus allowing many local peaks in the raw data to be eliminated when they do not occur within a period where the trend of RSSI data is rising.

The remainder of the local peaks during high state periods can be greatly reduced by tracking only the maximum peak within each period of a high state which are indicated by circles P in FIGS. 4 and 5. That is, even if local peak P2 was as large as depicted at P2', it would be rejected as anomalous data since it does not occur during a period of a high state/rising trend in the raw data and, moreover, is not even considered or processed and, being of short duration, cannot cause false detection of a rising trend while only the maximum peak during any given high state duration is reported.

Even this greatly reduced number of peaks can be further reduced in accordance with the invention by adjusting the sizes and relative sizes of the historical sample window 310 and the leading edge window 320 as can be appreciated by a comparison of FIGS. 4 and 5 in which the number of detected peaks captured and reported is reduced by reducing the number of detected rising and falling trends even though the raw data high state period is extended in duration. Note that peak P2' of FIG. 4 at the location of P2 in FIG. 5 would not be detected even when the high state periods are extended and thus substantial reductions in the number of peaks reported can be achieved without obscuring trends.

In practice, however, it is considered desirable to provide for adjustments, possibly in an adaptive manner, of the number of samples averaged over windows 310 and 320 in partial accommodation of the number of shielding flaws expected in view of the age, repair record and the like of the system since an older or less well maintained systems will be likely to have not only a greater number of shielding flaws but detected egress signals will reflect a much more complex system of peaks due to interference effects while, as alluded to above, additional peaks in RSSI samples will be caused as artifacts of large shielding flaws.

In summary, the parameters of sizes of the leading edge and historical sample windows, their relative sizes, the offset and possible overlap of the windows, and the threshold value all affect the sensitivity of the system and the number of peak RSSI values which are returned or retained from a set of samples but in significantly different degrees. Specifically, changes in the relative and absolute widths of windows principally changes sensitivity to small peaks in raw data and the degree of noise rejection while overlap of windows, if provided, can eliminate excess sensitivity to trends in noisy and complex signal environments since the number of samples included in both the historical sample window 310 and the leading edge window 320 tends to regulate the similarity of the variation of their respective averages. At the same time, changes in the offset of the leading edge window 320 from the historical sample window 310 principally alters sensitivity to rising trends and falling trends (and thus provides a coarse, incremental adjustment thereof) while the non-critical magnitude of the threshold, t, (which may be varied between 0.5 and 10 db) causes hysteresis in switching between rising and falling RSSI data trends by allowing control of the differences in averages between the windows 310, 320 required to declare a trend; thus functioning as a fine and continuous control over sensitivity to trends. Thus, providing for adjustment of these parameters allows tailoring of the response of the filter of FIG. 2 to the complexity of the individual signal strength environment where the invention may be applied so that the number of peaks reported can be sufficiently reduced to substantially eliminate "false positives" (each carrying a high cost if the "false positive" results in a work order) even if a small number of peaks actually due to flaws in shielding integrity (which are persistent and can be recovered in later reports) are lost in the process.

Returning now to FIG. 2, after initialization 205 and 207 is accomplished, the GPS location is read (210) and a determination is made as to whether or not the receiver 130 is moving. In general, as alluded to above, significant interference rejection is achieved by processing for characteristics which would be characteristic of moving toward or away from a flaw by detection of rising trends in raw RSSI samples. When the receiver is stationary, variation in RSSI samples is largely attributable to interference signals (especially since aircraft communications in the same frequency band may be likely to emanate from moving transmitters). Therefore, RSSI signals are only processed when the receiver 130 is in motion and, when the receiver is not in motion, the process in accordance with the invention assumes a stand-by state by simply looping until motion is detected as depicted at 215.

During periods that motion is detected, RSSI samples are taken and coupled with GPS location information (220) and rolling averages over the historical sample window and the leading edge window are computed as indicated at 225 and 230, respectively. At operation 235, the "found rise" flag or the like (initialized to false at operation 207 as noted above) is interrogated and the process initially branches to 240 where the leading edge window average is compared to the sum of the historical sample average increased by a threshold amount. If the leading edge average does not exceed that sum the process merely loops to 210 and is repeated for the next set of samples in respective windows 310, 320.

When the leading edge window average is found to exceed the sum, the state of the "found rise" flag or the like is set in operation 245 to true and the process again loops and a new average of samples is again computed, as before. However, since the "found rise" state is now true, the opposite branch will be taken at 235 to look for a peak as well as a termination of the rising trend in RSSI samples; the latter being detected at operation 250 where it is determined if the magnitude of the leading edge window average is less than the magnitude of the historical sample window average reduced by the threshold, t. If not, the rising trend is assumed to continue and the process loops to 210 while determining at 260 if the current RSSI sample is greater than the maximum peak value previously encountered during the course of the present high state and, if so, storing the current RSSI value as the maximum value for comparison with subsequently encountered RSSI values. If, however, the criterion of operation 250 is met, it is determined that the rising trend has terminated (e.g. that the trend is now falling, due to the hysteresis effect of threshold, t) and peaks found prior to detection of the next rising trend will not be of interest and that the maximum point in the previous rising trend will have been found. Therefore, as illustrated at operation 270, the maximum value previously stored at operation 260, as discussed above, is transferred or stored for further processing as will be discussed below in connection with FIG. 6 and the process loops to 210 to again look for a rising trend in RSSI values and, once such a trend is found, to track maximum RSSI peaks encountered during that high state/rising trend until the high state/rising trend terminates, and so on.

Thus, as described above, the number of peaks in a potentially extremely cluttered signal environment can be greatly reduced by the filtering processing of FIG. 2. The remaining peaks retained and reported by the filter of FIG. 2 will contain very few, if any, "false positives" caused by interference effects, artifacts and the like and the reportage will contain high spatial resolution information in regard to the location of the flaws in shielding integrity that the peaks represent. However, it should be understood that the reported peaks can be further reduced by additional processing as will now be discussed in connection with FIGS. 6 and 7 which reliably eliminates reported peaks which are likely to be duplicates (e.g. representing the same shielding flaw) even though they are differently detected and reported.

It will be recalled from the foregoing that receivers 130 are preferably located in vehicles which will be traveling on public roads in the vicinity of the cable system on a daily basis. Broadly, the additional processing of FIG. 6 inspects each new peak detected and reported and determines whether or not to retain it based on comparisons with surrounding flaws already logged onto the system. Once the nearby presumptive flaws in shielding integrity are identified, a one-to-one comparison is performed between the new peak and reported points of detection of RSSI peaks already reported in descending signal strength order. Depending on the result(s) of such comparison, the newly reported peak may be retained (often accompanied by discarding of an existing peak) or discarded.

Figure 6:
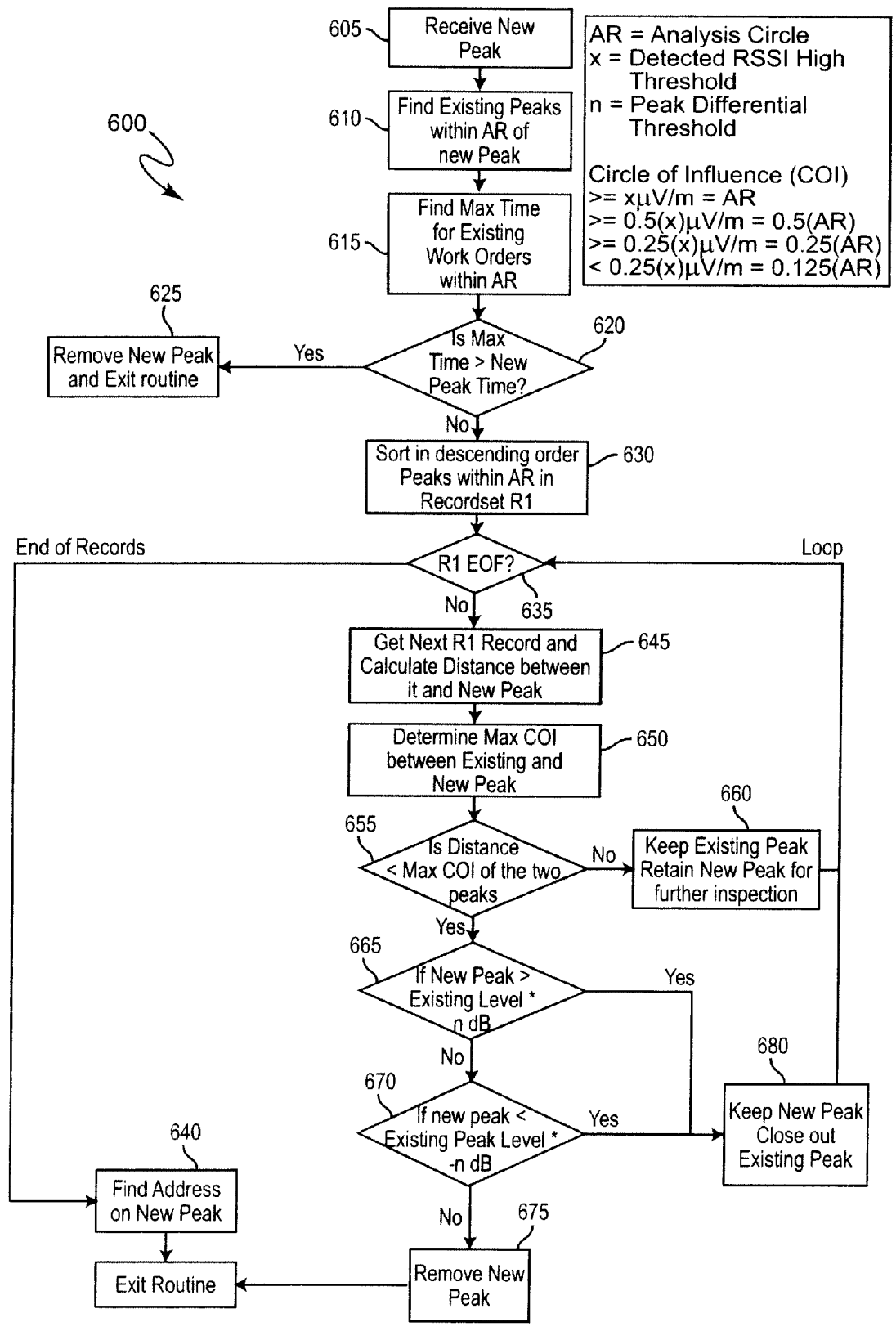
FIG. 6 is a flow chart of further processing in accordance with the present invention for eliminating duplicate reports of potential signal egress resulting from detections made at different locations and resolving duplicate reports into a single detection report in appropriate circumstances as reflected in the reports developed in accordance with the processing depicted in FIGS. 2-5.

A basic concept of the processing and methodology depicted in FIG. 6 is that of a "circle of influence" (COI). Broadly, a circle of influence first approximates the location and severity of a signal egress leak or shielding integrity flaw by the location of a reported detection and the signal strength thereof. The circle of influence is thus a construct to estimate whether or not one reported peak influences or is influenced by another reported peak. This construct can be visualized as illustrated in FIG. 7.

Figure 7:
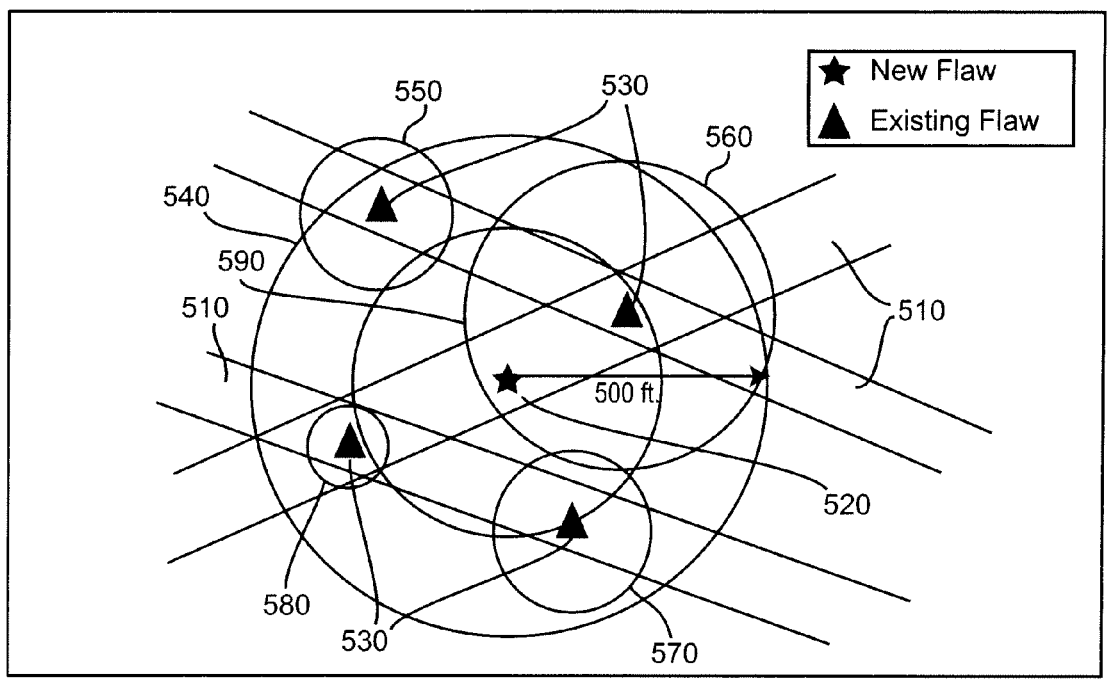
FIG. 7 is a diagram useful for explaining the concept of circle of influence as utilized in the processing illustrated in FIG. 6.

FIG. 7 depicts three intersecting roadways 510 along which detection of peaks may typically occur. Reference numeral 520 indicates a location of detection of a new reported peak. Four previously reported peaks 530 are also illustrated as being within a circle having a radius (hereinafter referred to as an analysis radius, AR) around the new peak detection location. (It should be understood that locations 520 and 530 of reported peaks are the points at which detection was achieved and not necessarily the location of a flaw that caused the peak but which are generally a usable approximation thereof since cable systems are generally located along roadways. Reported peaks detected from vehicles on roadways which are not proximate to portions of the cable system would ordinarily be discarded based on reported GPS location alone and are assumed not to be present in the data being processed in accordance with FIG. 6 or will be discarded during the duplicate elimination processing.)

For purposes of limiting the number of comparisons that are performed in the process of FIG. 6, the previously reported and retained peaks within the analysis radius circle 540 of the new peak detection location 520, if any, are determined by searching previously reported detection locations. In this exemplary case, four such locations 530 are found. The analysis radius 540 is not a circle of influence and is somewhat arbitrarily applied but preferably corresponds to the currently practical maximum working distance for peak detection for a receiver of a given sensitivity and thus generally corresponds to a maximum distance for any possible interaction to occur that would result in a peak detection. Thus any locations of peak detections beyond such a distance may be safely ignored. However, the analysis radius could be set to a smaller dimension if desired, such as when the number of existing peaks within such a radius is larger than can be conveniently processed consistent with detection and discarding of the majority of peaks which are, in fact, duplicates originating from the same shielding integrity flaw. Circles of influence 550, 560, 570, 580 and 590 are then scaled based on the signal level of the detected peak to determine if any detected peak can influence or be influenced by another detected peak. The preferred radius of a circle of influence for a detected and retained peak is determined as follows: if the detected signal strength is greater than 200 µV/m, the radius of the circle of influence is equal to AR; if the signal strength is less than 200 µV/m but greater than 100 µV/m, the radius of the circle of influence is AR/2 (e.g. 590); if the signal strength is less than 100 µV/m but greater than 50 µV/m, the radius of the circle of influence is AR/4 (e.g. 550 and 570); and if the signal strength is less than 50 µV/m, the radius of the circle of influence is AR/8 (e.g. 580). Such a scaling is not critical to the practice of the invention but has been found to produce more useful and economical results for purposes of management of a cable communication system than proportionality to signal strength or theoretical reduction in signal strength with increase of propagation distance.

Once the radii of the circles of influence are scaled in accordance with the detected signal strength, the new peak location and each existing peak location are considered as a pair in order of decreasing signal strength of the existing (e.g. previously detected, retained and logged into the system) peak and the distance between them is compared with the radius of the larger COI of the pair. If the distance between them is greater than the radius of the larger COI of the peaks of the pair of peaks, it is considered that there is no relationship or interdependence between the detected peaks, the existing peak detection location is valid, the new peak is retained for further processing (which may or may not cause it to be discarded) and the process loops to 635 for similar processing of the new peak against the next existing peak in the ordered list of neighboring peaks. It should be noted in this regard that once it is determined that the new peak and a particular existing peak are unrelated, processing in regard to that existing peak is complete. The same determination can be made in regard to any or all of the remaining peaks within the analysis radius of the new peak. Each existing peak for which such a determination is made is flagged to be retained at operation 660 even though no further action is taken by operation 660 in regard to the new peak after operation 660 is performed in regard to any existing peak in the list.

If, however, the distance between the new peak and an existing peak is less than the radius of the COI of either such that the COI of one or both peaks encompasses the other, it is assumed that the two peak detections may be related in some way such as both being due to the same flaw or interference effects from the same plurality of flaws. Accordingly, since the invention is directed to minimizing the number of work orders issued and eliminating issuance of duplicate work orders even if some valid detections are lost, a signal strength comparison is made to determine, for each comparison of detection locations, which location should be retained and which should be discarded. The preferred criterion is quite simple: if the signal strengths of the detection locations of each pair compared differ by more than a predetermined amount, n db, from each other as determined at operations 665 and 670, the new detection location is retained and the existing detection location is discarded (e.g. marked as obsolete) at operation 680 but if the signal strengths are within n db of each other the new detection location is discarded and the existing detection location is retained. It should be noted that one detection location is removed for each comparison made in operations 665 and 670 and thus the processing of a new peak can result in the removal of more than one existing detection location at operation 680 which loops to operation 635 to conduct comparisons with other existing peaks even though a relationship between the existing detection locations had not previously been detected. Such a case would be exemplified by a new peak location having a very large circle of influence encompassing several existing peak locations where signal strength and COI radius was small. In other words, the flaw causing the newly detected peak could prove to be the underlying cause of several previously reported peak detections which had previously appeared to be unrelated.

If, after all of the comparisons are made as determined at 635, the new peak detection location is retained, an address for the location is determined (e.g. by a reverse geocode operation) and the new peak detection location is added to the system as depicted at operation 640 for issuance of a work order which can now be done with high confidence that it uniquely represents a shielding integrity flaw which does not correspond to and is not represented by any other detected peak.

Returning now to FIG. 6 the preferred processing and methodology for removing duplicative detected peaks will now be explained in detail. This preferred processing and methodology includes several processes which substantially accelerate the overall processing as well as some steps which are preferred, as a practical matter, for convenient application of the invention to monitoring of an actual cable communication system.

The process begins at 605 when a new peak and its location is received from the first portion 110 of the peak detection process described above in connection with FIG. 2 which severely limits the number of peaks reported to those most reliably determinable to be due to shielding integrity flaws in the cable communication system. Then, the existing detected peak locations are determined (610) and the latest (referred to as "Max. Time") corresponding work order is found (615) among work orders which have been issued. Since a detected peak may have been stored for some period of time before being reported to the central facility, the time stamps of the work orders or peak detections previously reported are compared with the peak detection time stamp of the new peak data. If the "Max Time" of existing peak detections already in the system is more recent than that of the new peak, as determined at 620, the new peak is deemed to be obsolete and is removed at operation 625. If not, the work orders or peak detections already in the system and within the analysis radius of the new peak location are sorted (630) in descending order of detected signal strength and placed in a list, R1, which can then be processed in order.

Beginning at operation 635 which determines if any data exists or remains in list R1 to be processed, the next record in list R1, if any, is obtained and its distance from the new peak is calculated at operation 645 and the greater of the radii of the circles of influence (Max COI) of the new peak and the existing peak is determined (650) and the distance and Max COI are compared at operation 655. If the distance is greater than Max COI, the detected peaks are determined to be not related or interdependent and both the new peak location and the existing peak location are retained although the new peak location may later be removed through further processing as alluded to above.

If the distance is less than the COI of either the new peak or the currently processed existing peak, sequential tests are made at operations 665 and 670 to determine if the signal strength of the new peak is more than n db above or below the signal strength of the existing peak and, if so, the new peak is retained, the existing peak is invalidated at operation 680 and the process loops to 635 to process the next existing peak detection location in list R1, if any. (The rationale for removing the existing peak even if substantially larger/stronger than the new peak is based on a number of practical considerations and possible scenarios such as the possibility that the existing peak had already been remedied and the existing peak information may be obsolete by the time the new peak was detected. In such a case, retaining the new peak would serve the useful purpose of verifying the effectiveness of repairs on the obsolete existing peak. Similarly, the strong existing peak, prior to such remediation, could have swamped or prevented the new peak from having been detected earlier. Further, since the new peak and the existing peak have been determined to be within a COI of, in this case, the stronger existing peak, retention of the new peak for purposes of issuance of a work order will serve the same purpose as the work order for the existing peak since repair work should remedy all signal egress detected within the practical limit of detection distance on which the analysis radius is based, as discussed above.) Otherwise the process continues to operation 675 where the new peak is removed. The process may then be exited since no further processing of the new peak detection location is required since it has been determined to be a duplicate of a detection location already existing in the system.

If, upon the process looping to 635, it is discovered that no further existing peaks/detection locations remain in list R1 after all comparisons of distance, COI and field strength have been performed, the new peak can be considered, with a high level of confidence to be not only due to a shielding integrity flaw but not otherwise represented by any other peak currently in the system. At this point an address relative to the cable system (e.g. a street address or a location in the cable system) is determined for purposes of issuance of a work order by reverse geolocation or the like and the process is exited.

In view of the foregoing, it is seen that the invention provides for reliable detection of signal egress and doing so in an extremely harsh and complex signal and electromagnetic noise environment with many and unpredictable interference effects while rigidly excluding peaks which are likely to represent noise and interference effects and stringently limiting the number of detected peaks which are reported. For the relatively few remaining peaks following such processing, each new peak is rigorously inspected and compared against previously reported peaks to assure that different detected peaks are unrelated; allowing removal of duplicative new peaks as well as some further reduction of existing peaks if examination of a new peak reveals a relationship between other peaks not previously discovered. Since detected peaks which have been removed in accordance with such processing will again be reported if caused by a shielding integrity flaw and thus will be persistent, the system and methodology of the invention has proven extremely effective in reducing cost due to issuance of erroneous and duplicative work orders while improving the possible level of maintenance of a cable communication system.

While the invention has been described in terms of a single preferred embodiment, those skilled in the art will recognize that the invention can be practiced with modification within the spirit and scope of the appended claims.

The invention claimed is:

1. A method of detecting and reporting shielding integrity flaws in a geographically extended cable communication system using a mobile receiver in a vehicle having a position reporting system, said method comprising steps of:
   detecting a rising trend in received signal strength at said mobile receiver during movement of said vehicle;
   comparing a signal strength peak received at said mobile receiver against other peaks received during said rising trend in signal strength,
   retaining and reporting a signal strength and location of a signal strength peak found to be largest during said rising trend in signal strength while discarding lesser peaks during said rising trend in signal strength and signal strength peaks occurring during periods other than during said rising trend in signal strength.

2. The method as recited in claim 1, including the further steps of;
   determining if the signal strength peak reported in said retaining and reporting step represents a signal source previously retained and thus is a duplicate of an existing signal strength peak previously reported, and
   discarding one of the signal strength peaks determined to be a duplicate of the other.

3. The method as recited in claim 2, wherein said step of determining if the signal strength peak reported in said retaining and reporting step is a duplicate of an existing signal strength peak previously reported includes a further step of;
   forming a list of previously reported signal strength peaks that are within a given distance of the signal strength peak reported in said retaining and reporting step wherein said list includes signal strength peaks in descending order of signal strength.

4. The method as recited in claim 3, including the further steps of;
   assigning a circle of influence radius in accordance with signal strength for said signal strength peak reported in said retaining and reporting step and each existing signal strength peak in said list,
   comparing said circle of influence radius with a distance between said signal strength peak reported in said retaining and reporting step and signal strength peak in said list, and
   retaining both signal strength peaks if said distance is greater than said circle of influence radius.

5. The method as recited in claim 4, comprising the further steps of;
   comparing signal strengths of said signal strength peak reported in said retaining and reporting step and each said signal strength peak in said list, and
   removing a signal strength peak in said list and retaining the signal strength peak reported in said retaining and reporting step if the signal strengths differ by more than a predetermined amount, or
   discarding said signal strength peak reported in said retaining and reporting step if the signal strengths differ by less than said predetermined amount.

6. The method as recited in claim 5, including the further steps of;
   determining a location of any signal strength peak reported in said retaining and reporting step which is not discarded in said discarding step.

7. The method as recited in claim 1, wherein said step of detecting a rising trend includes further steps of;
   computing a first rolling average of a first number of received signal strength samples,
   computing a second rolling average of a second number of received signal strength samples, said second number of signal strength sample including at least one signal strength sample more recent than signal strength samples in said first number of signal strength samples, and
   comparing said first rolling average and said second rolling average, and
   determining a rising trend when said second rolling average exceeds said first rolling average by more than a first threshold amount.

8. The method as recited in claim 7 including the further step of determining a termination of a rising trend when said first rolling average exceeds said second rolling average by more than a second threshold amount.

9. The method as recited in claim 8 wherein said first threshold amount and said second threshold amount are the same.

10. The method as recited in claim 1, including the further steps of
    detecting motion of said mobile receiver, and
    performing said detecting step only when said motion of said mobile receiver is detected.

11. A method of detecting and reporting shielding integrity flaws in a cable communication system, said method comprising steps of:
    reporting detection locations and measured signal strength at said detection location of signal strength peaks detected using a mobile receiver in a vehicle including a position reporting system,
    upon detection of a new signal strength peak, determining if a signal strength peak reported in said reporting step is a duplicate of or related to an existing signal strength peak previously reported at another detection location based on circles of influence centered on a detection location of each reported detection location and having a radius in accordance with the measured signal strength at the corresponding detection location of a signal peak, and
    discarding the detection location of one or more of the signal strength peaks determined to be a duplicate of or related to the other such that if the measured signal strengths at respective detection locations differ by more than a predetermined amount, a newly reported detection location of a newly reported signal strength peak is retained and the existing detection location of an existing signal strength peak is discarded and, if the measured signal strengths at respective detection locations differ by less than said predetermined amount, the newly reported detection location of the newly detected signal strength peak is discarded and the existing detection location of the existing signal strength peak is retained.

12. The method as recited in claim 11, wherein said step of determining if the signal strength peak reported in said reporting step is a duplicate of or related to an existing signal strength peak previously reported includes a further step of:
    forming a list of previously reported signal strength peaks that are within a given distance of the signal strength peak reported in said reporting step wherein said list includes signal strength peaks in descending order of signal strength.

13. The method as recited in claim 12, including the further steps of:

assigning a circle of influence radius in accordance with signal strength for said signal strength peak reported in said detecting step and each existing signal strength peak in said list, comparing said circle of influence radius with a distance between a detected location of said signal strength peak reported in said retaining and reporting step and a detected location of a signal strength peak in said list, and retaining both signal strength peaks if said distance is greater than said circle of influence radius.

14. Apparatus for detecting and reporting shielding integrity flaws in a geographically extended cable communication system comprising:

a mobile receiver in a vehicle and operating in a carrier frequency band of said cable communication system to provide received signal strength samples, a global positioning system for periodically reporting a location of said mobile receiver, a register for holding said samples, means for computing averages of different groups of samples in said register, a comparator for comparing said averages and detecting a rising trend in said samples, means for determining a maximum signal strength sample during a duration of said rising trend in said samples, and means for retaining and reporting signal strength and detection location of the maximum signal strength sample, wherein the maximum signal strength sample has a signal strength found to be largest during said rising trend in signal strength, while discarding lesser peaks during said rising trend in signal strength and signal strength peaks occurring during periods other than during said rising trend in signal strength.

15. A computer program product comprising a computer readable medium or a communication link providing signals comprising a program for controlling a processor, said program, when run on said processor, causing said processor to perform steps of:

detecting a rising trend in received signal strength of data received from a mobile receiver in a vehicle while said vehicle is in motion, comparing a signal strength peak received at said mobile receiver against other peaks received during said rising trend in signal strength, retaining and reporting the signal strength peak found to be largest during said rising trend in signal strength and the detection location of said signal strength peak found to be largest while discarding lesser peaks and peaks occurring during periods other than during said rising trend in signal strength.

16. A computer program product comprising a computer readable medium or a communication link providing signals comprising a program for controlling a processor, said program, when run on said processor, causing said processor to perform steps of:

storing detection locations and measure signal strengths at said detection locations of signal strength peaks, determining if a newly input signal strength peak is a duplicate of or related to a previously stored signal strength peak at another detection location based on circles of influence centered on a detection location of each reported detection location and having a radius in accordance with the measured signal strength at the corresponding detection location of a signal peak, and discarding the detection location of one or more of the signal strength peaks determined to be a duplicate of or related to the other such that if the measured signal strengths at respective detection locations differ by more than a predetermined amount, a newly reported detection location of a newly reported signal strength peak is retained and the existing detection location of an existing signal strength peak is discarded and, if the measured signal strengths at respective detection locations differ by less than said predetermined amount, the newly reported detection location of the newly detected signal strength peak is discarded and the existing detection location of the existing signal strength peak is retained.

* * * * *